(12) United States Patent
Pfahnl et al.

(10) Patent No.: US 7,554,323 B2
(45) Date of Patent: Jun. 30, 2009

(54) DIRECT FACILITY WATER TEST HEAD COOLING ARCHITECTURE

(75) Inventors: Andreas C. Pfahnl, Goffstown, NH (US); Luis A. Muller, San Diego, CA (US); Ray Mirkhani, Northridge, CA (US)

(73) Assignee: Teradyne, Inc., North Reading, MA (US)

( * ) Notice: Subject to any disclaimer, the term of this patent is extended or adjusted under 35 U.S.C. 154(b) by 134 days.

(21) Appl. No.: 11/715,650

(22) Filed: Mar. 8, 2007

(65) Prior Publication Data
US 2008/0041568 A1 Feb. 21, 2008

Related U.S. Application Data

(60) Provisional application No. 60/780,910, filed on Mar. 9, 2006.

(51) Int. Cl.
G01R 1/02 (2006.01)

(52) U.S. Cl. .................................... 324/158.1; 324/760

(58) Field of Classification Search .................. None
See application file for complete search history.

(56) References Cited

U.S. PATENT DOCUMENTS

| 4,862,075 A | * | 8/1989 | Choi et al. | 324/753 |
| 5,307,018 A | * | 4/1994 | Gadgil | 324/537 |
| 5,510,958 A | * | 4/1996 | Shimabara et al. | 361/719 |
| 5,644,248 A | * | 7/1997 | Fujimoto | 324/760 |
| 5,889,651 A | * | 3/1999 | Sasaki et al. | 361/699 |

* cited by examiner

Primary Examiner—Paresh Patel
(74) Attorney, Agent, or Firm—K&L Gates LLP

(57) ABSTRACT

An apparatus is provided to cool high-performance instruments within a semiconductor test head using direct facility water. The direct facility water cooling apparatus consists of an air chamber, a first base to receive and removably mount the instrument within the air chamber, a test head inlet in fluid communication with the first base and a facility water supply, a test head discharge in fluid communication with the first base and a facility drain, and a fan in fluid communication with the air chamber inlet to induce the flow of air from the air chamber inlet to the air chamber outlet.

3 Claims, 5 Drawing Sheets

DIRECT FACILITY WATER TEST HEAD COOLING ARCHITECTURE

CROSS-REFERENCE TO RELATED APPLICATIONS

This application claims priority to and the benefit of U.S. Provisional Patent Application No. 60/780,910, filed on Mar. 9, 2006, the entire contents of which are incorporated by reference herein.

FIELD OF THE INVENTION

The present invention relates generally to thermal regulation within automatic testing equipment ("ATE") used to test semiconductor devices and, more particularly, to a system for temperature control of one or more instruments in the test head within the testing equipment.

BACKGROUND OF THE INVENTION

In manufacturing a semiconductor device, testing equipment is typically used for quality control of a finally produced device. In such testing equipment a test head consists of one or more instruments which perform a variety of tests on the device. The temperature control of these instruments is usually accomplished using either a liquid chiller or an air-cooling system. However such test equipment is typically limited in cooling capacity and unsuitable for cooling high-end, high-performance instruments.

Improved testing equipment would be realized if three main functional requirements of the cooling system could be achieved: high-performance, scalability and compactness. High-performing cooling systems would enable high-end instrument development and could be leveraged to improve reliability of tests conducted. A cooling system that scales according to cooling capacity required by the test head is also desirable. Such a system would allow users of low-power instruments to avoid the cost of excess cooling capacity needed by a test head populated with high-power instruments. Finally, a cooling system that can be integrated into a test head would enable a "tester-in-a-test head" system architecture that is compact and easy to work with.

A test head that uses facility water for cooling purposes presents its own unique challenges. Bio-growth and freezing are typically prevented by the addition of chemicals to the facility water. This can leave traces of glycol or polyglycol behind making the water inappropriate for use with bare aluminum. Facility water is generally cooled to a temperature lower than ambient temperature of a laboratory or manufacturing facility. With relative humidity ranges between 30-60%, the dew point at an extreme temperature-relative humidity combination can be above the entering water temperature. As a consequence, water often condenses on the external plumbing surfaces. Facility water may also be undesirable for direct cooling because of the persistent presence of dissolved salts and particles as well as the threat of corrosion to the plumbing. Thus, facility water has been typically employed as a primary loop fluid while another coolant was employed in a secondary, or process loop. This arrangement is similar to a heat exchanger with a dedicated test head coolant loop. Systems developed by Agilent, Schlumberger, Advantest, LTX and Teradyne are examples of this mode.

Typically, such secondary loops are placed in large and expensive cabinets. These cabinets are bulky, and are usually fixed within a section of the room. As a consequence, such systems are frequently dependent on process loop placement and are expensive, cumbersome arrangements.

SUMMARY OF THE INVENTION

Thus, a need exists for a high-performance cooling system capable of using direct facility water in the test head.

In satisfaction of this need, an embodiment of the present invention provides an apparatus for cooling an instrument in a semiconductor device test head consisting of an air chamber having an air chamber inlet and an air chamber outlet. The apparatus also consists of a first base having a first base inlet and a first base outlet to receive and removably mount the instrument within the air chamber so that the instrument is exposed to the air chamber, a test head inlet in fluid communication with the first base inlet and a facility water supply, a test head discharge in fluid communication with the first base outlet and a facility drain, and a fan in fluid communication with the air chamber inlet to induce the flow of air from the air chamber inlet to the air chamber outlet.

BRIEF DESCRIPTION OF THE DRAWINGS

These and other aspects of this invention will be readily apparent from the detailed description below and the appended drawings, which are meant to illustrate and not to limit the invention and in which.

DETAILED DESCRIPTION OF THE PREFERRED EMBODIMENT

The systems and apparatus for cooling test head instruments by directly coupling the test head to a facility water supply will now be described with respect to various embodiments. However, the skilled artisan will readily appreciate that the systems described herein are merely exemplary and that variations can be made without departing from the spirit and scope of the invention. In this description, like numbers refer to similar elements within various embodiments of the present invention.

Embodiments of the present invention provide systems that use direct facility water to cool instruments within a test head of a testing apparatus. This may be accomplished by coupling the test head directly to a facility water supply. In other embodiments, the system is structured to allow air flow through spaces between the instruments within the test head. This may be accomplished by spacing the instruments sufficiently apart in an air chamber. Air flows from an air chamber inlet, through spaces between the instruments and discharges through an air chamber outlet. Flow of air may be induced by the use of fans.

Figure 1:
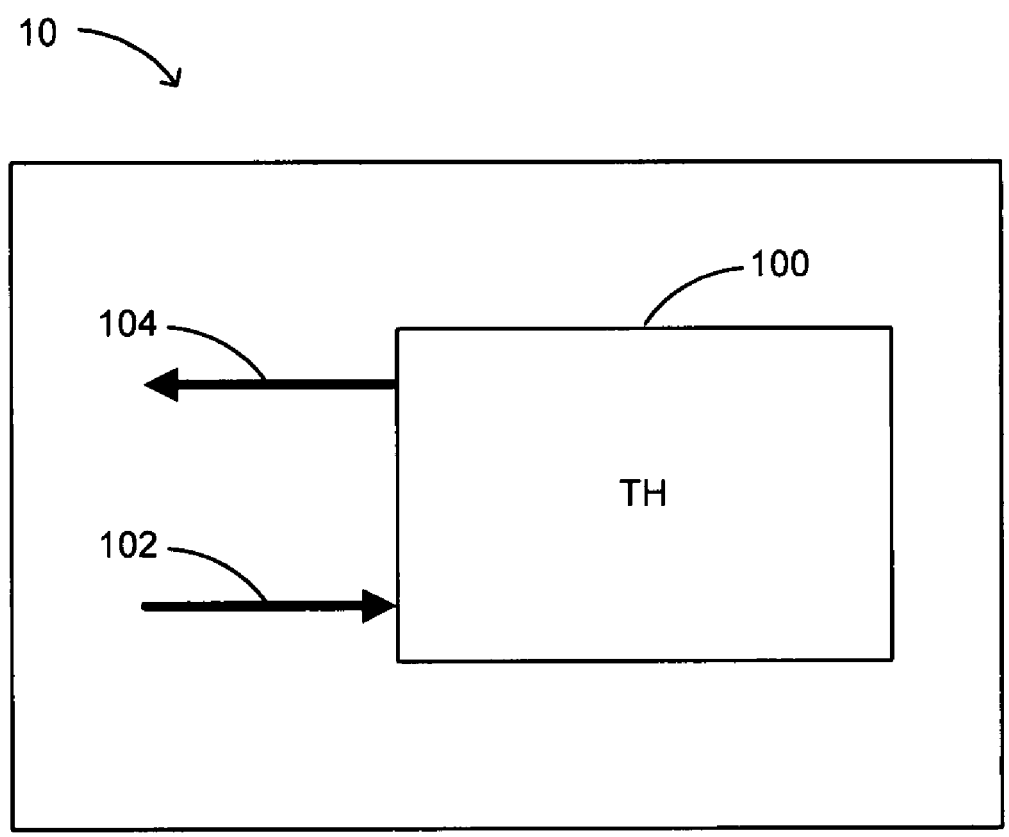
FIGS. 1, 2 and 3 are schematic diagrams of an exemplary cooling system for cooling a test head according to embodiments of the present invention.

FIG. 1 is a schematic diagram of an exemplary cooling system 10 for cooling a test head 100 having an inlet 102 and a discharge 104, according to an embodiment of the present invention. Test head 100 may be used to house various instruments to test a semiconductor device. According to such an embodiment, inlet 102 is connected directly to a facility water supply. Discharge 104 is configured to remove cooling water from test head 100, such as by a pump or gravity drain. In some embodiments, discharge 104 may be configured to return the cooling water back to the facility water line.

Figure 2:
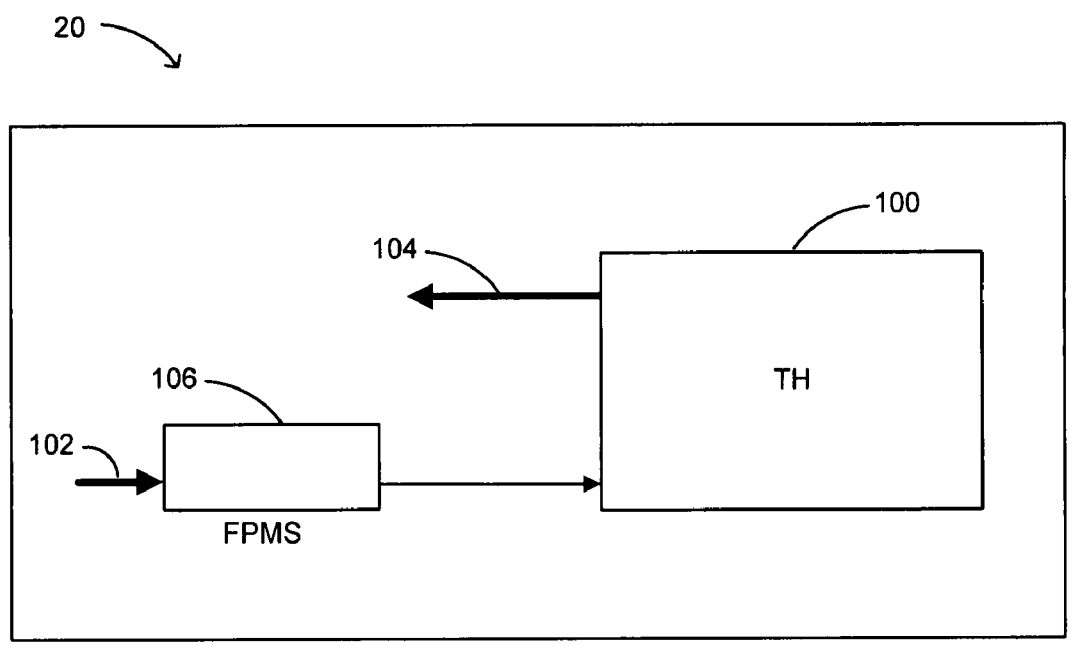

FIG. 2 is a schematic diagram of an exemplary cooling system 20 for cooling test head 100. System 20 is similar in many respects to system 10 except that system 20 includes a fluid polishing and monitoring system ("FMPS") 106 interposed between inlet 102 and test head 100. FMPS 106 may be configured to include one or more components to condition the fluid entering test head 100, such as for biogrowth inhibition, deionization, heating and particulate filtration. Such components may be arranged within FMPS 106 to allow fluid entering from inlet 102. Two or more components associated with FMPS 106 may be arranged serially or in parallel. In some embodiments, the fluid entering from inlet 102 may be allowed to flow through a select number of components. In other embodiments, redundant units of each type of component may be installed.

Figure 3:
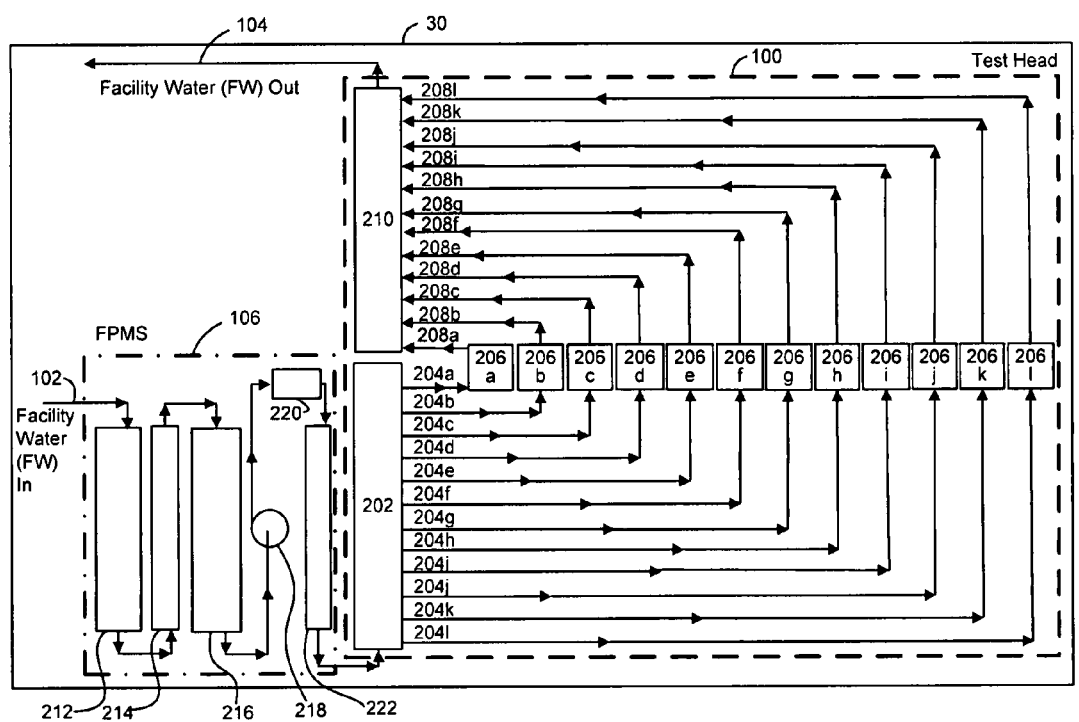

FIG. 3 is a schematic diagram of an exemplary cooling system 30 for cooling test head 100. In the illustrated embodiment, system 30 includes test head 100, inlet 102, outlet 104 and FPMS 106. Test head 100 includes a supply manifold 202, a plurality of inlet channels 204a-204l, a plurality of instruments 206a-206l under test, and a return manifold 210. As illustrated, FPMS 106 includes a particulate filtration component 212, a deionization component 214, an in-line heating component 216, a pressure boosting component 218, a flow rate regulation component 210, and a bio-growth inhibition component 222. Although FMPS 106 is illustrated as providing six components, those skilled in the art will appreciate that FMPS 106 may include more or less components each of which may provide one or more functions.

As illustrated, supply manifold 202 is configured to collect and forward incoming facility water to instruments 206a-206l within test head 100. Return manifold 210 collects the facility water that has passed through instruments 206a-206l and forwards it to discharge 104.

Instruments (206a-206l) generally comprise circuit boards or channel cards that may be mounted on one or more bases within test head 100 in order to interface with the tested semiconductor device in a controlled fashion.

Particulate filtration component 212 may be configured to ensure the facility water is free from particles greater than a predetermined size. For example, particulate filtration component 212 may be configured to remove particles greater than 1,000, 100 or 10 microns. Deionization component 214 may be used to remove dissolved salts.

In-line heating component 216 may be configured to minimize condensation on external plumbing surfaces. In various embodiments, in-line heating component 216 is responsive to ambient temperature and relative humidity measurements. In some embodiments, in-line heating component 216 may be configured to limit the water temperature rise, for example, by about 1.0 degree centigrade.

Pressure boosting component 218 may be configured to maintain a relatively consistent flow rate inside test head 100. In an embodiment, pressure boosting component 218 may be a single booster pump or a plurality of booster pumps connected either in series, parallel or a combination thereof. A variety of pumps may be used including, for example, a magnetic drive pump. Each such drive pump typically occupies about 4"×4"×4" of space and has a 10 pounds/sq. inch boost capacity. Flow regulator 220 may be used to throttle fluid flow through inlet 102. Additionally, bio-growth inhibition component 222 may be used to treat facility water with bio-growth inhibitors.

Figure 4:
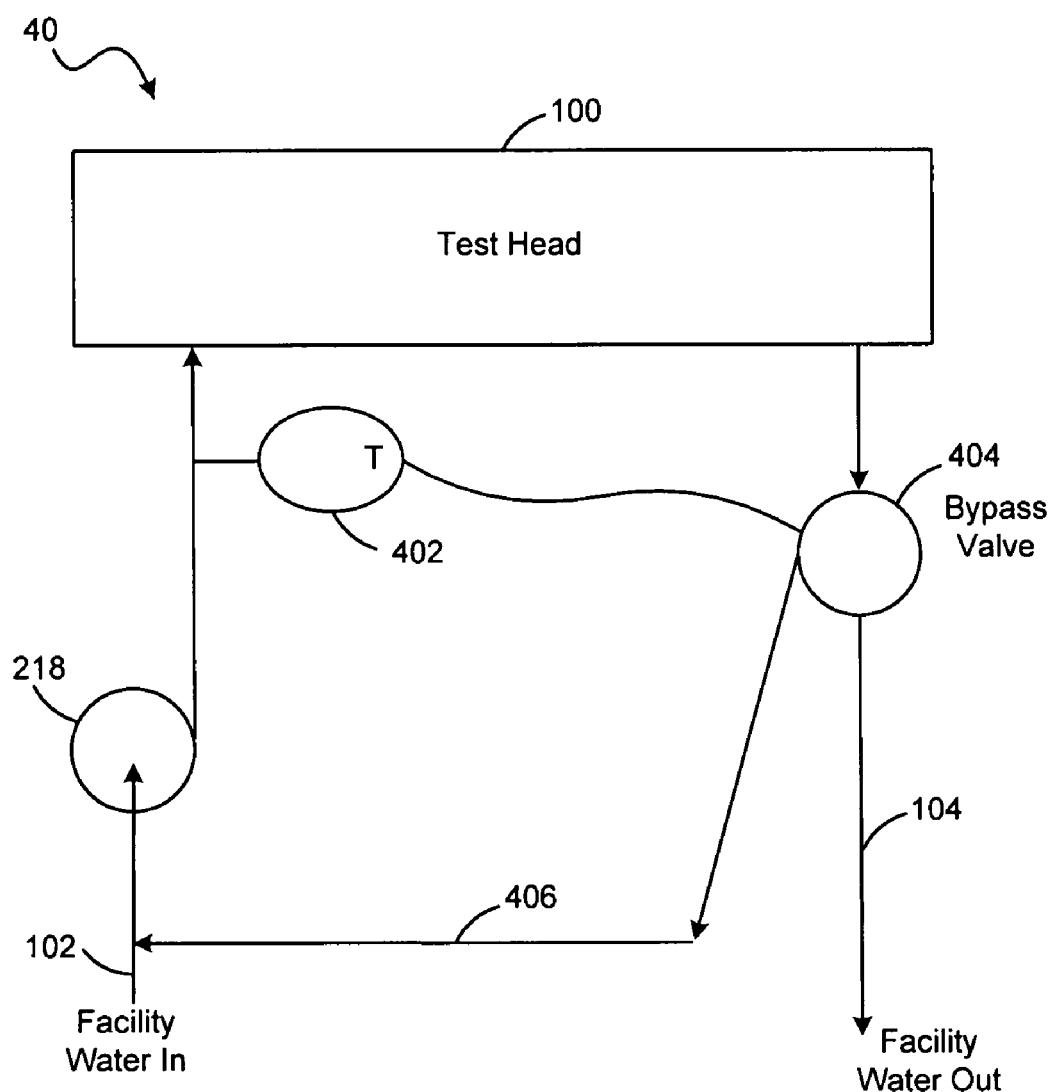
FIG. 4 is a schematic diagram of exemplary cooling system for directly preheating cooling water injected into a test head.

FIG. 4 is a schematic diagram of exemplary cooling system 40 for directly preheating cooling water injected into test head 100 in accordance with an embodiment of the present invention. System 40 includes test head 100, inlet 102, discharge 104, pressure boosting component 218, a temperature sensor 402, a by pass valve 404, and a preheat line 406. Although not shown, it should be apparent to one skilled in the art that FMPS 106 may be included in system 40 without departing from the principles of the invention.

As illustrated, temperature sensor 402 is configured to track the temperature of incoming facility water. Temperature sensor 402 provides feedback in the form of an input signal to by pass valve 404. By pass valve 404 is provided to adjust the ratio of outgoing facility water to incoming facility water at inlet 102. The remainder of the outgoing facility water is directed towards the discharge 104. Preheat line 406 is configured to mix the outgoing facility water with the incoming facility water from inlet 102. Check valves (not shown) may be used to prevent a backflow of the outgoing facility water.

Figure 5:
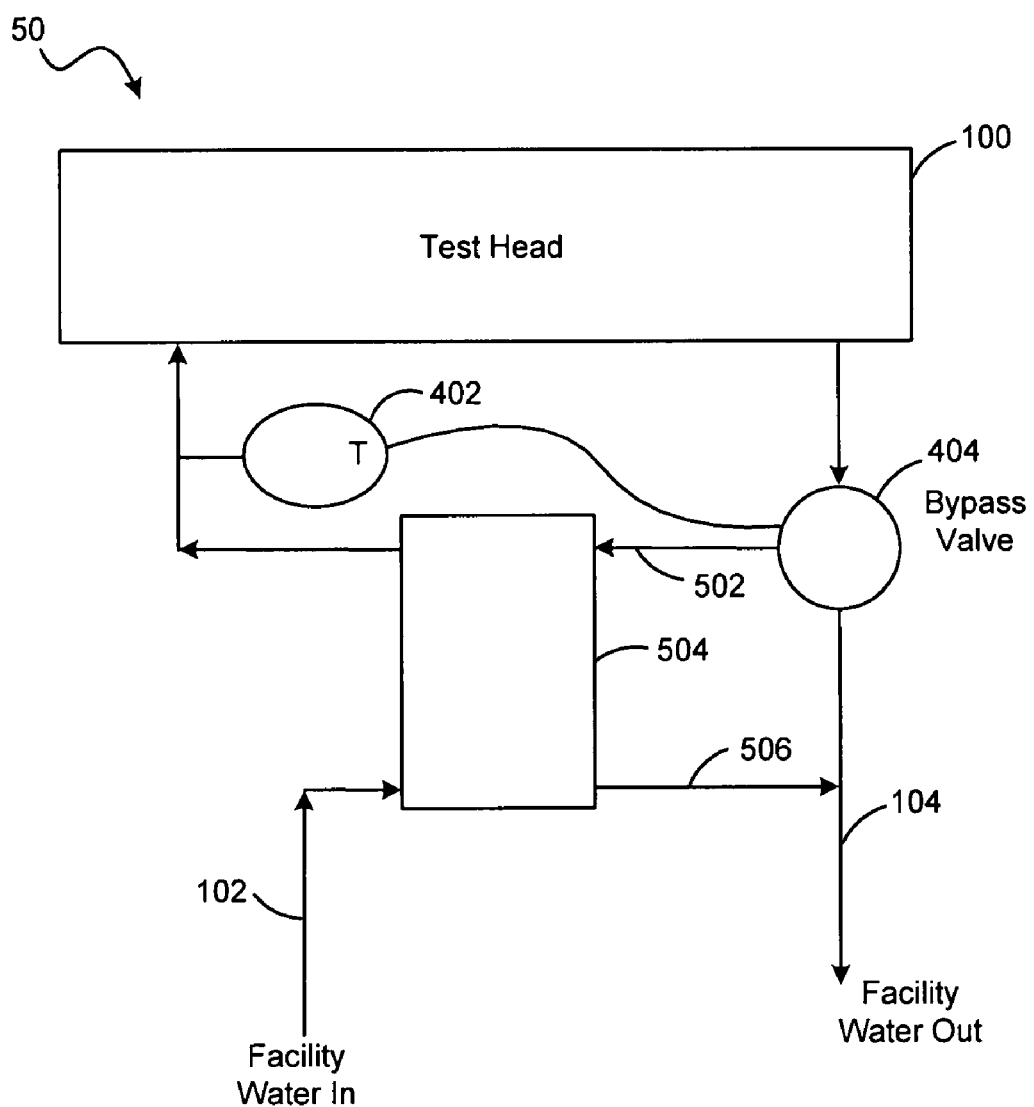
FIG. 5 is a schematic diagram of an exemplary system for indirectly preheating water injected into a test head in accordance with an embodiment of the present invention.

FIG. 5 is a schematic diagram of an exemplary cooling system 50 for indirectly preheating water injected into test head 100 in accordance with an embodiment of the present invention. System 50 includes test head 100, inlet 102, discharge 104, temperature sensor 402, by pass valve 404, a heat exchanger 504, a heat exchanger inlet 502, and a heat exchanger discharge 506.

As illustrated, heat exchanger inlet 502 directs the outgoing facility water to heat exchanger 504. Heat exchanger discharge 506 is configured to return the outgoing facility water from heat exchanger 504 back to discharge 104.

In operation, facility water is pumped directly into test head 100 as illustrated in FIG. 1. Incoming facility water flows from the tap in the manufacturing facility through inlet 102 to test head 100. After performing its function within test head 100, the facility water flows towards discharge 104. As illustrated in FIG. 2, FPMS 106 may be provided in-line with facility water cooling system in accordance with an embodiment of the present invention.

Referring now to FIG. 3, the facility water from inlet 102 passes through FPMS 106, and internal components 212-222. Internal components 212-222 perform several facility water conditioning activities such as particulate filtration, deionization, heating, pressure boosting, flow rate regulation, and bio-growth inhibition before forwarding the facility water to test head 100.

The facility water flow rate is controlled by the combination of pressure boosting component 218 and flow rate regulator 220. The facility water is then collected in supply manifold 202 and subsequently forwarded through paths 204a-204l provided to direct the flow of incoming water to instruments 206a-206l. After distribution of the facility water to cool instruments 206a-206l, return paths 208a-208l carry the facility water to return manifold 210. The collected facility water is then forwarded to discharge 104 connecting test head 100 to facility water drain.

Those skilled in the art will recognize the many benefits and advantages afforded by the present invention. The invention provides the user with a semiconductor testing system that utilizes direct facility water for the liquid cooling portion. Thus, the invention enables high-power instruments operating on a semiconductor device to be cooled using a scalable liquid cooling system. The apparatus is also compact thus enabling it to be packaged within the tester.

While the invention has been particularly shown and described with references to certain embodiments, it will be understood by those skilled in the art that various changes in form and detail may be made therein without departing from the spirit and scope of the invention.

We claim:

1. An apparatus for cooling an instrument in a semiconductor device test head comprising: an air chamber, wherein the air chamber further comprises an air chamber inlet and an air chamber outlet; a first base configured to receive and removably mount the instrument within the air chamber so that the instrument is exposed to the air chamber, and wherein the first base includes a first base inlet and a first base outlet; a test head inlet in fluid communication with the first base inlet and wherein the test head inlet is in fluid communication with a facility water supply; means for preheating the facility water supply that enters test head inlet; a test head discharge in fluid communication with the first base outlet and wherein the test head discharge is in fluid communication with a facility drain; and a fan in fluid communication with the air chamber inlet, wherein the fan is configured to induce the flow of air from the air chamber inlet to the air chamber outlet.

2. The apparatus of claim 1, further comprising a supply manifold interposed between the test head inlet and the first base inlet and a return manifold interposed between the first base outlet and the test head discharge.

3. The apparatus of claim 1, further comprising a filter interposed between the facility water supply and the test head inlet, wherein the filter is configured to remove particles as small as 10 microns in diameter.

* * * * *